United States Patent [19]

Hutter et al.

[11] Patent Number: 4,805,071
[45] Date of Patent: Feb. 14, 1989

[54] HIGH VOLTAGE CAPACITOR FOR INTEGRATED CIRCUITS

[75] Inventors: Louis N. Hutter, Richardson; John P. Erdeljac, Plano, both of Tex.

[73] Assignee: Texas Instruments Incorporated, Dallas, Tex.

[21] Appl. No.: 126,442

[22] Filed: Nov. 30, 1987

[51] Int. Cl.[4] .................. H01G 4/10; H01G 7/00; H01L 27/02
[52] U.S. Cl. ........................... 361/313; 357/51; 29/25.42
[58] Field of Search ............... 357/51; 361/311, 312, 361/313; 29/25.42

[56] References Cited

U.S. PATENT DOCUMENTS

| | | |
|---|---|---|
| 3,320,484 | 5/1967 | Riley et al. ............................ 357/51 |
| 3,864,817 | 2/1975 | Lapham et al. ...................... 357/51 X |
| 4,458,295 | 7/1984 | Durschlag et al. .................. 357/51 X |
| 4,675,982 | 6/1987 | Noble et al. ........................ 357/51 X |

FOREIGN PATENT DOCUMENTS

| | | |
|---|---|---|
| 225662 | 12/1983 | Japan ..................................... 357/51 |
| 5662 | 1/1984 | Japan ..................................... 357/51 |
| 184556 | 10/1984 | Japan ..................................... 357/51 |
| 195859 | 11/1984 | Japan ..................................... 357/51 |

*Primary Examiner*—Donald A. Griffin
*Attorney, Agent, or Firm*—Leo N. Heiting; Richard G. Coalter; Melvin Sharp

[57] ABSTRACT

High voltage capacitors particularly suited for a BiC-MOS process are formed in conjunction with prior art low voltage capacitors. In a first embodiment of a high voltage capacitor, an N+ region (66) is used as a first plate of the capacitor. The thermal gate oxide layer (48) used in conjunction with the MOS transistors (22,24) is also grown over the N+ region (66). Since the thermal oxide growth over the N+ region is accelerated, a thicker oxide region will be formed. A polysilicon plate (70) is formed over the thick oxide region (68) at the same time the first plate (12) of the low voltage capacitor (10) is formed. Alternatively, a nitride layer (18) may be formed over the thick oxide layer (68). The nitride layer (18) is also used in the formation of a low voltage capacitor (10).

19 Claims, 2 Drawing Sheets

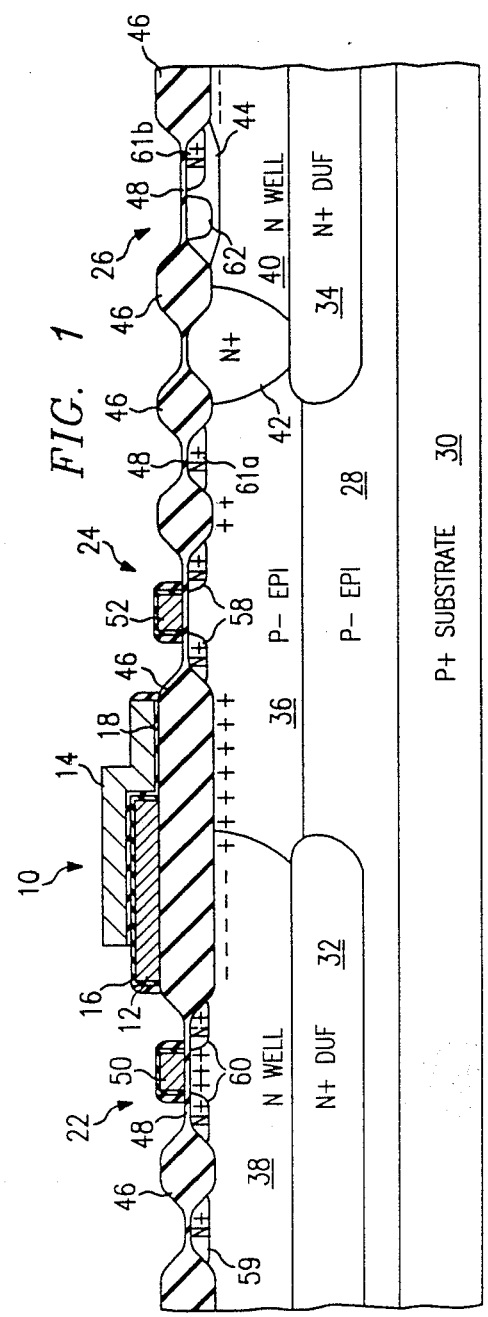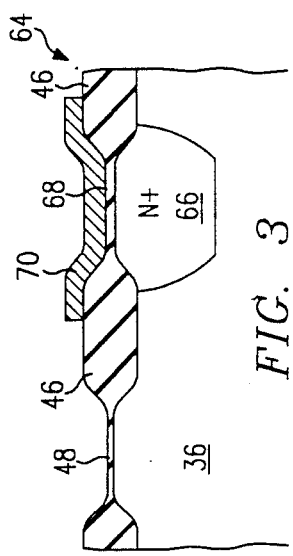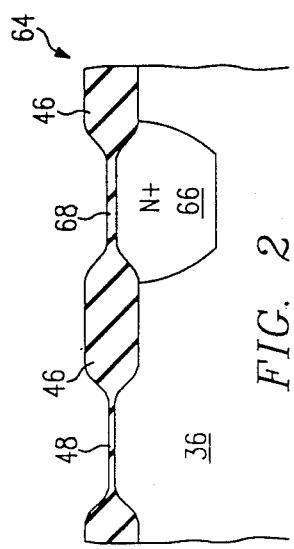

HIGH VOLTAGE CAPACITOR FOR INTEGRATED CIRCUITS

BACKGROUND OF THE INVENTION

Many integrated circuit processes now provide for both digital and analog functions to be integrated on one circuit. Typically, a merged bipolar-CMOS (hereinafter "BiCMOS") process is used to provide both analog and digital devices. While digital designs seldom need capacitors, analog designs frequently use capacitors.

Heretofore, BiCMOS processes have made only one type of capacitor available, normally a low voltage, high value capacitor. However, it is often necessary to support the analog functions with high voltage capacitors, capable of handling voltages in the twenty-to-thirty volt range.

Importantly, the processes used to form the high voltage capacitors should not affect the characteristics of the bipolar and MOS devices as well as the low voltage capacitors. Otherwise, the use of "standard cells" would be precluded in the design of the circuit. Standard cells are subcircuits which may be used in a variety of applications, thereby reducing design time and increasing reliability.

Therefore, a need has arisen in the industry for a high voltage capacitor for use in BiCMOS and other processes, which may be fabricated on an integrated circuit without altering the characteristics of other devices thereon.

SUMMARY OF THE INVENTION

In accordance with the present invention, a capacitor is provided which substantially eliminates or prevents the disadvantages and problems associated with other capacitors for use in integrated circuits.

In a first embodiment of the present invention, high voltage and low voltage capacitors are made in the same processing steps. The first plates of the high voltage and low voltage capacitors are covered with a thin oxide layer and a thin nitride layer. A photoresist layer is placed over the low voltage capacitor, and an etch is performed through the nitride layer associated with the high voltage capacitor. A subsequent heat cycle causes thermal oxide growth on the exposed oxide layer of the high voltage capacitor, resulting in a thicker insulation region. A second plate is formed over the high voltage and low voltage capacitors to complete the structure.

In a second embodiment, a capacitor having a N type region as a first plate and a polysilicon or other conductive material as a second plate is provided. A thermal oxide is grown over the N region to act as an insulator between the plates. The oxide over the heavily doped N+ region will grow faster than the oxide over a lightly doped P− epitaxy layer or Nwell, thereby providing a thick insulator region for the capacitor without affecting the MOS gate oxide, which is important for maintaining CMOS performance.

Alternatively, the oxide layer in the second capacitor embodiment may be subjected to a second heat cycle concurrent with the heat cycle used in the first capacitor embodiment, thereby creating a high voltage capacitor with a thicker dielectric layer. Also, a nitride layer may be formed over the oxide layer to increase the thickness of he dielectric.

In another embodiment of a capacitor using an N type region as a capacitor plate, the pad oxide and nitride layers used to mask the surface of the semiconductor during formation of the field oxide regions are left on the N type region as a dielectric, and a polysilicon plate is formed thereon. Because the nitride layer used for the field oxide mask is generally thicker than the nitride layer used in the low voltage capacitors, a higher voltage capability is provided.

In yet another embodiment of a capacitor using an N type region as a capacitor plate, a first dielectric layer is formed over the N type region, followed by formation of a polysilicon plate overlying the first dielectric, a second dielectric layer overlying the polysilicon plate, and a second polysilicon plate overlying the second dielectric layer. The Voltage is connected to the N type region and the second plate, allowing the intermediate plate to float, since it is electrically isolated from the N type region and the second plate. This structure effectively produces two stacked capacitors, the voltage across one being less than the voltage across the entire structure. Thus, a higher voltage may be applied before either of the individual capacitors breaks down.

The capacitors of the present invention have the advantage of allowing high voltage and low voltage capacitors to be formed with essentially the same processing steps and without affecting the performance of the active devices.

BRIEF DESCRIPTION OF THE DRAWINGS

For a more complete understanding of the present invention and the advantages thereof, reference is now made to the following descriptions taken in conjunction with the drawings in which:

FIG. 1 illustrates a cross-sectional side view of a typical low voltage capacitor used with BiCMOS processes;

FIG. 2 illustrates a cross-sectional side view of a first stage in forming a high voltage capacitor using a deep N+ region;

FIG. 3 illustrates a cross-sectional side view of a second stage in forming a high voltage capacitor using a deep N+ region;

DETAILED DESCRIPTION OF THE INVENTION

Figure 7:
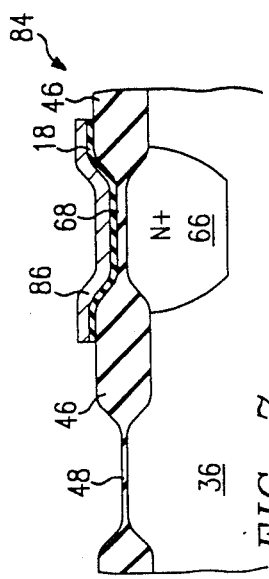
FIG. 7 illustrates a cross-sectional side view of a second embodiment of a high voltage capacitor using a deep N+ region.

The preferred embodiment of the present invention is best understood by referring to FIGS. 1-9 of the drawings, like numerals being used for like and corresponding parts of the various drawings.

FIG. 1 illustrates a prior art low voltage capacitor as used in a BiCMOS process. The low voltage capacitor 10 comprises a first plate 12 separated from a second plate 14 by an oxide layer 16 and a nitride layer 18.

The low voltage capacitor 10 is shown in an embodiment of a BiCMOS process described in detail in copending application Ser. No. 120,558 filed Nov. 13, 1987, to Hutter et al., entitled "High Voltage Merged Bipolar/CMOS Technology," which is incorporated by reference herein. The BiCMOS process creates PMOS transistors 22, NMOS transistors 24 and NPN transistors 26. The BiCMOS process avoids altering the characteristics of the CMOS transistors 22 and 24 during processing.

In the preferred process flow, a first P− epitaxy layer 28 is formed on a P. substrate 30. The first P− epitaxy layer 28 is oxidized and patterned to define N+ DUF (diffusion under film) 32 and 34 under the PMOS device 22 and the NPN device 26, respectively. A second P− epitaxy layer 36 is formed over the first P− epitaxy layer 28. Nwell regions 38 and 40 are formed in the second P− epitaxy layer 36 to house the PMOS 22 and NPN 26 devices, respectively. A N+ collector 42 is formed in the Nwell region 40.

A base region 44 is diffused into the Nwell 40 and field oxide regions 46 are grown between devices. A gate oxide 48 is grown over the surface of the structure. A first polysilicon layer is deposited on the surface of the wafer and is doped, patterned and etched to form the gates 50 and 52 of the PMOS transistor 22 and NMOS transistor 24 and the first plate 12 of the low voltage capacitor 10. An interlevel oxidation is used to form the thin oxide layer 16 over the gates 50 and 52 as well as 10 the first plate 12. The nitride layer 18 and the second plate 14 are formed to complete the low voltage capacitor 10. Subsequently, the N type source/drain regions 58 of the NMOS transistor 24 are formed along with the PMOS backgate contact 59 and the P type source/drain regions 60 of the PMOS transistor 22 are formed along with the NMOS backgate contact 61a and the NPN base contact 61b. An N type emitter region 62 is subsequently created.

The value of a capacitor is directly proportional to its area and the dielectric constant of the insulating material, and is inversely proportional to the thickness of the dielectric. The formula for computing the capacitance of a given structure is:

$$C = (e_{matl}/t_{matl}) * A_{cap}$$

where:

$e_{matl}$ = dielectric constant of the insulator
$t_{matl}$ = the thickness of the insulator
$A_{cap}$ = the area of the capacitor Typical dielectric constants for various materials are: oxide (3.9 $e_O$), and nitride (7.5 $e_O$),
where:

$e_O$ is the permittivity of free space, equal to $8.85 \times 10^{-14}$ F/cm.

Since the usual goal is to minimize the area of the capacitor in achieving the desired capacitance value, a higher capacitance value can be obtained either by reducing the dielectric thickness or by using an insulator with a higher dielectric constant.

The maximum voltage that can be reliably placed across a dielectric is directly proportional to the dielectric thickness, $t_{matl}$. If the voltage exceeds the breakdown voltage, the dielectric may rupture, leading to a short between the plates of the capacitors and catastrophic failure of the device.

The high voltage capacitors of the present invention illustrated in FIGS. 2–6 are particularly suited for use in the BiCMOS process described above, and other similar processes.

One embodiment of a high voltage capacitor compatible with BiCMOS processes is illustrated in FIGS. 2 and 3. The N+ high voltage capacitor 64 is formed using a N+ region 66 which may be created in the processing step used to form the N+ collector region 42 for the NPN transistor 26. Subsequently, the field oxide regions 46 are formed as described in connection with FIG. 1. In an important aspect of the invention, the capacitor dielectric 68 may be formed at the same time as the gate oxide 48. The oxide growth over the N+ region 66 grows at a faster rate than the oxide over regions which are not heavily doped with an N+ material. Therefore, in forming the N+ high voltage capacitor 64, a thick oxide 68 is obtained to allow higher capacitor voltage, while not affecting the thickness of the gate oxide 48.

FIG. 3 illustrates a second stage of the development of the N+ high voltage capacitor 64 in which the second plate 70 is formed over the capacitor dielectric 68. The second plate 70 may be formed from the same polysilicon layer used to implement the first plate 12 of the low voltage capacitor 10. Thus, this embodiment of the present invention has the advantage of implementing a high voltage capacitor with a thick oxide, without affecting the thickness of the gate oxide 48, which in part determines the operating characteristics of the active devices 22, 24 and 26. Furthermore, the N+ high voltage capacitor 64 can be formed without additional masking steps, since the N+ region 66 may be formed in connection with the N+ collector 42, the capacitor dielectric 68 is formed in conjunction with the gate oxide 48, and the second plate 70 is formed in conjunction with the first plate 12 of the low voltage capacitor 10.

Figure 4:
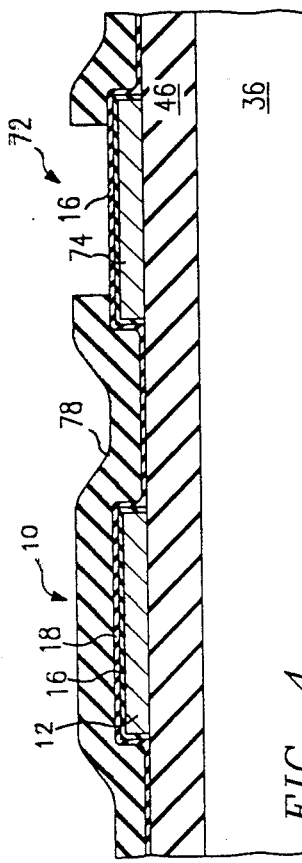
FIG. 4 illustrates a cross-sectional side view of a first stage in forming a thick oxide polysilicon-polysilicon capacitor.
Figure 5:
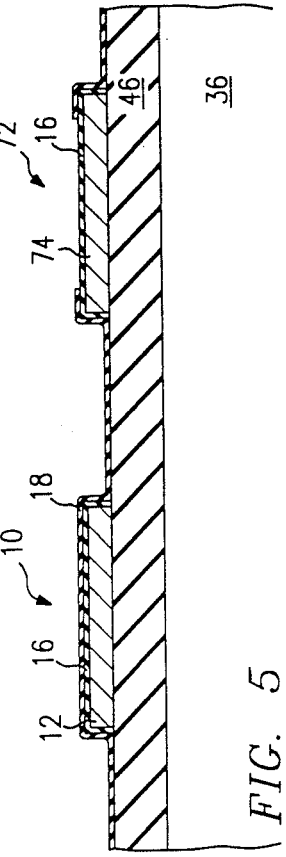
FIG. 5 illustrates a cross-sectional side view of a second stage in forming a thick oxide polysilicon-polysilicon capacitor.
Figure 6:
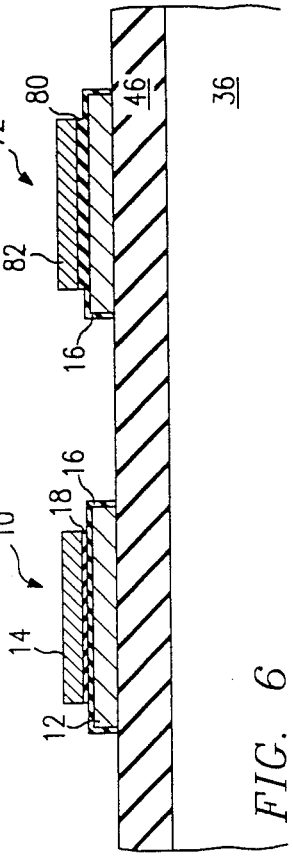
FIG. 6 illustrates a cross-sectional side view of a third ,stage in forming a thick oxide polysilicon-polysilicon capacitor.

FIGS. 4–6 illustrate another embodiment of a thick oxide high voltage capacitor 72 in conjunction with the low voltage capacitor 10. The first plate 12 of the low voltage capacitor is formed in the same step as the first plate 74 of the high voltage capacitor 72. Typically, this involves depositing a layer of polysilicon over a field oxide region 46 and doping, patterning and etching the polysilicon to form the plates 12 and 74. Subsequently, a thin oxide layer 16 is formed over the plates 12 and 74 and a nitride layer 18 is formed over the surface of the structure. A photoresist mask 78 is patterned and etched to expose a portion of the nitride layer 18 above the first plate 74 of the high voltage capacitor 72.

Referring to FIG. 5, an etch is performed on the exposed portion of the nitride layer 18, forming a window to the thin oxide layer 16 therebelow.

Referring to FIG. 6, a thermal oxidation is performed, thus producing a thick oxide region 80 within the window. The nitride layer 18 inhibits oxide growth elsewhere. Subsequently, the second plate 14 of the low voltage capacitor 10 and the second plate 82 of the high voltage capacitor 72 are formed in the same processing step, typically by patterning and etching a second polysilicon layer.

It should be noted that variations on the N+ high voltage capacitor 64 can be obtained by combining the processes described in FIGS. 2 and 3 with the processes described in FIGS. 4–6. One alternative embodiment of the N+ high voltage capacitor can be obtained by subjecting the capacitor dielectric 68 to a second thermal oxidation at the same time that the thick oxide region 80 is being formed in conjunction with the high voltage capacitor 72. Thus, two forms of N+ high voltage capacitors 64 may be provided on one integrated circuit, having different voltage and capacitive value characteristics. The second plate of this alternative N+ high voltage capacitor may be formed along with the second plate of the low voltage capacitor 10, by patterning and etching the second layer of polysilicon.

Another embodiment of the N+ high Voltage capacitor 64 is illustrated in FIG. 7. The high voltage capacitor 84 uses a N+ region 66 for its first plate and a capacitor dielectric 68 as described in connection with FIGS. 2 and 3. However, the high voltage capacitor 84 differs from the N+ high voltage capacitor 64 in that the nitride layer 18, also used in connection with the low voltage capacitor 10, is formed between the capacitor dielectric 68 and the second plate 86. The second plate 86 may be formed in conjunction with the second plate 14 of the low voltage capacitor 10 using a second polysilicon layer.

Figure 8:
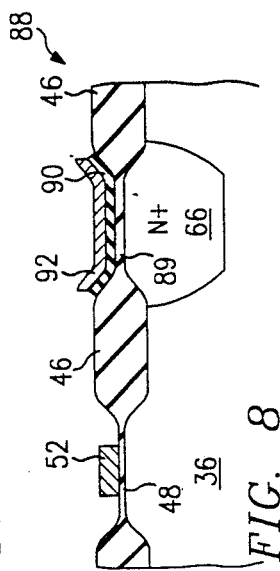
FIG. 8 illustrates a cross-sectional side view of a third embodiment of a high voltage capacitor using a deep N+ region; and FIG, 9 a cross-sectional side view of a fourth embodiment of a high voltage capacitor using a deep N+ region.

FIG. 8 illustrates another embodiment of the N+ high voltage capacitor 64. The high voltage capacitor 88 uses an N+ region 66 for its first plate and uses a pad oxide 89 and a nitride layer 90 for the capacitor dielectric. The second plate 92 may be formed from the first polysilicon layer used to form the gates 50 and 52 of the MOS device and the first plate 12 of the low voltage capacitor 10.

The nitride layer in FIG. 8 is placed over the pad oxide layer 89 in order to selectively grow the field oxide regions 46. This nitride layer is normally removed after the formation of the field oxide regions 46. However, by masking portions of the nitride layer overlying the N+ regions 42 prior to removal of the nitride layer, the nitride layer 90 of the capacitor 88 may be formed without additional nitride depositions. Since the nitride layer used to define the field oxide regions 46 is generally thicker than the nitride layer 18 used in the low voltage capacitor 10, the resulting capacitor would allow higher voltage than that of the capacitor 84 shown in FIG. 7.

Figure 9:
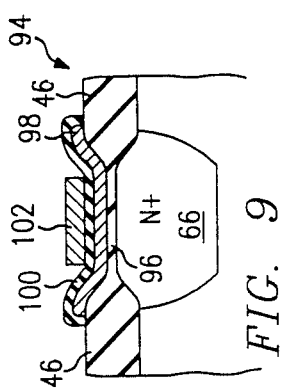

FIG. 9 illustrates another N+ high voltage capacitor 94. This capacitor uses the N+ region 66 as its first plate covered by a first dielectric layer 96. A middle plate 98 is disposed above the first dielectric layer 96 and is covered by a second dielectric layer 100. A second plate 102 is formed on top of the second dielectric layer 100. This structure creates two capacitors: the first comprising the N+ region 66 and the middle plate 98, and the second comprise the middle and second plates.

By stacking two capacitors on top of one another, a high voltage structure can be made. Electrical contacts are made to the N+ region 66 and the second plate 102, allowing the middle plate 98 to float. The floating plate will maintain a voltage level between that of the N+ region 66 and the second plate 102. Hence, the voltage across any one capacitor will be less than across the entire structure, allowing a higher applied voltage before either of the individual capacitors would electrically rupture.

The middle plate 98 may be formed in connection with the first plate 12 of the low voltage capacitor 10, typically being formed from a first polysilicon layer. The second plate 102 may be formed in conjunction with the second plate 14 of the low voltage capacitor 10, from the second polysilicon layer. The first dielectric layer 96 may be formed from any material suitable to prevent conduction between the N+ region 66 and the polysilicon middle plate 98, while the second dielectric layer 100 may be made from any material suitable to prevent conduction between the polysilicon middle plate 98 and the second plate 102.

Hence, six capacitors having varying capacitive values and voltage characteristics may be formed on one integrated circuit. When used in conjunction with the BiCMOS process, only slight modifications in the process need be implemented in order to add the capacitors. Notably, the addition of the capacitors to the integrated circuit require no changes to the original CMOS heat cycles or gate oxide thicknesses, which would alter the characteristics of the CMOS devices. Additionally, the formation of the high voltage capacitors do not change the characteristics of the low voltage capacitors.

Although the preferred embodiment of the invention has been described in detail, it should be understood that various changes, substitutions and alterations can be made therein without departing from the spirit and scope of the invention as defined by the appended claims.

What is claimed is:

1. A method of forming a high voltage capacitor, and a low voltage capacitor on a substrate having a semiconductor surface portion, comprising the steps of:
    (a) forming first plates for the respective high and low voltage capacitors on the semiconductor surface;
    (b) forming a relatively thin oxide layer over said first plates;
    (c) forming a nitride layer over said oxide layer
    (d) removing a portion of said nitride layer overlying the plate of the high voltage capacitor without removing the nitride layer overlying the plate of the low voltage capacitor;
    (e) performing a heat cycle to thermally oxidize the region exposed by the removed nitride to produce a relatively thick oxide layer over the first plate of the high voltage capacitor without alteration of said thin oxide layer of said low voltage capacitor; and
    (f) forming second plates over said first plates, the plates of the low voltage capacitor being separated by the combination of said thin oxide layer and said nitride layer and the plates of the high voltage capacitor being separated by said thick oxide layer for enabling independent control of electrical characteristics of said high and low voltage capacitors.

2. The method of claim 1 wherein said step of forming said first plates comprises the steps of depositing, patterning and etching a polysilicon layer on said surface to concurrently form said first plates and a gate electrode of an MOS device.

3. The method of claim 2 wherein said step of forming said second plates comprising the steps of depositing, patterning and etching a further polysilicon layer.

4. The method of claim 2 and further comprising the step of forming a field oxide layer between said first plates and the semiconductor surface.

5. The method of claim 2 wherein said step of forming said relatively thin oxide region comprises thermally growing oxide over said respective first plates and said gate electrode.

6. A method of forming a high voltage capacitor on a substrate having a semiconductor surface portion in conjunction with forming an NPN device, and MOS device and a low voltage capacitor, comprising the steps of:
   forming a first plate of the high voltage capacitor comprising a first N+ region while concurrently forming an second N+ region for a collector of said NPN device in said substrate;
   thermally growing an oxide layer over said first N+ region and over a further region for housing said MOS device, said oxide layer over said further region comprising a gate oxide for said MOS device, said oxide growth over said first N+ region (i) being thicker than said gate oxide, (ii) being grown without altering the thickness of said gate oxide and (iii) comprising a dielectric for said high voltage capacitor; and
   forming a second plate over the portion of said oxide layer associated with the high voltage capacitor while concurrently forming a given one of first and second plates for said low voltage capacitor over another region of said substrate.

7. The method of claim 6 and further comprising the steps of:
   forming a first nitride layer overlying said first plate of said high voltage capacitor
   forming a second nitride layer overlying said first plate of said low voltage capacitor, said first nitride layer being thicker than said second nitride layer;
   and wherein said first plate of said low voltage capacitor is formed concurrently with said second plate of said high voltage capacitor and a gate electrode of said MOS device.

8. The method of claim 6 wherein further comprising the steps of:
   forming a first nitride layer overlying said oxide layer of said high voltage capacitor; and
   concurrently forming a second nitride layer overlying said first plate of said low voltage capacitor, said first and second nitride layers being of equal thickness and wherein said second plate of said high voltage capacitor is formed concurrently with said second plate of said low voltage capacitor.

9. The method of claim 6 and further comprising the steps of:
   overlying said first plates of said high and low voltage capacitors with a nitride layer;
   removing a portion of said nitride layer of said high voltage capacitor;
   thermally growing oxide on the exposed oxide layer; and
   forming a gate electrode for said MOS device concurrently with the formation of said first plate of said low voltage capacitor and said second plate of said high voltage capacitor.

10. The method of claim 6 wherein said step of forming a second plate for said high voltage capacitor comprises the step of forming a polysilicon layer and etching said polysilicon layer to concurrently define said second plate of the high voltage capacitor, said gate electrode of said MOS device and the first plate of the low voltage capacitor.

11. The method of claim 6 wherein said step of forming a second plate for said high voltage capacitor comprises the step of forming a polysilicon layer and etching said polysilicon layer to concurrently define said second plate of the high voltage capacitor and the second plate of the low voltage capacitor.

12. The method of claim 6 and further comprising the steps of:
   defining field oxide regions with a masking layer, a portion of said masking layer being disposed over said first plate of said high voltage capacitor;
   forming said field oxide regions; and
   removing portions of said masking layer such that said portion disposed over said first plate of said high voltage capacitor is not removed.

13. The method of claim 12 wherein said step of defining field oxide regions comprises the steps of forming a first nitride layer overlying said substrate and removing portions of said nitride layer in areas defining said field oxide regions and further comprising forming a second nitride layer between said plates of said low voltage capacitor that is thinner than said first nitride layer.

14. A high voltage capacitor comprising:
   a first capacitor plate comprising an N+ region;
   a first insulating layer overlying said first capacitor plate;
   a middle capacitor plate comprising a first conductive layer overlying said first insulating layer;
   a second insulating layer overlying said middle capacitor plate;
   a second capacitor plate comprising a second conductive layer overlying said second insulating layer; and
   circuitry to connect a voltage across said first and second plates, said middle plate being electrically isolated from said first and second plates and from said circuitry such that said middle plate assumes a voltage intermediate to the voltages at said first and second plates.

15. The capacitor of claim 14 wherein said second and middle capacitor plates comprise a polysilicon material.

16. The capacitor of claim 15 wherein:
said high voltage capacitor is formed in an integrated circuit including a low voltage capacitor; and
said low voltage capacitor includes a first plate of the same material as said middle plate of said high-voltage capacitor and a second plate of the same material as said second plate of said high voltage capacitor.

17. The capacitor of claim 15 wherein:
said high voltage capacitor is formed in an integrated circuit including a transistor having an N+ collector region of the same material as said first plate of said high voltage capacitor; and
said integrated circuit further includes a low voltage capacitor having a first plate of the same material as said middle plate of said high voltage capacitor and a second plate of the same material as said second plate of said high voltage capacitor.

18. The capacitor of claim 15 wherein:
said high voltage capacitor is formed in an integrated circuit including a bipolar transistor having an N+ collector region of the same material as said first plate of said high voltage capacitor; and
said integrated circuit further includes an MOS transistor having a gate electrode of the same material as said middle plate of said high voltage capacitor.

19. The capacitor of claim 15 wherein:

said high voltage capacitor is formed in an integrated circuit including a bipolar transistor, an MOS transistor and a low voltage capacitor;

said bipolar transistor having an N+collector region of the same material as said first plate of said capacitor;

said MOS transistor having a gate electrode of the same material as said middle plate of said high voltage capacitor; and wherein said low voltage capacitor includes a first plate of the same material as said middle plate of said high voltage capacitor and a second plate of the same material as said second plate of said high voltage capacitor.

* * * * *